US012610652B2

(12) United States Patent
Liu et al.

(10) Patent No.: US 12,610,652 B2
(45) Date of Patent: Apr. 21, 2026

(54) SOLAR CELL AND MANUFACTURING METHOD THEREFOR, PHOTOVOLTAIC MODULE, AND PHOTOVOLTAIC SYSTEM

(71) Applicant: TRINA SOLAR CO., LTD., Changzhou (CN)

(72) Inventors: Chengfa Liu, Changzhou (CN); Daming Chen, Changzhou (CN); Hong Chen, Changzhou (CN); Yifeng Chen, Changzhou (CN)

(73) Assignee: TRINA SOLAR CO., LTD., Changzhou (CN)

( * ) Notice: Subject to any disclaimer, the term of this patent is extended or adjusted under 35 U.S.C. 154(b) by 0 days.

(21) Appl. No.: 18/806,953

(22) Filed: Aug. 16, 2024

(65) Prior Publication Data

US 2025/0081666 A1 Mar. 6, 2025

(30) Foreign Application Priority Data

Aug. 30, 2023 (CN) .......................... 202311109529.2

(51) Int. Cl.
*H10F 77/30* (2025.01)
*H10F 71/00* (2025.01)
*H10F 77/164* (2025.01)

(52) U.S. Cl.
CPC .......... *H10F 77/311* (2025.01); *H10F 71/00* (2025.01); *H10F 71/1221* (2025.01); *H10F 71/128* (2025.01); *H10F 77/1642* (2025.01)

(58) Field of Classification Search
None
See application file for complete search history.

(56) References Cited

U.S. PATENT DOCUMENTS

| | | | | |
|---|---|---|---|---|
| 2010/0258444 A1* | 10/2010 | Weiner | .................. | H10F 77/211 205/137 |
| 2011/0041911 A1* | 2/2011 | Lee | ........................ | H10F 77/315 257/E31.124 |
| 2013/0019945 A1* | 1/2013 | Hekmatshoar-Tabari | .................. | H10F 10/17 136/258 |

FOREIGN PATENT DOCUMENTS

| | | |
|---|---|---|
| CN | 102956756 A | 3/2013 |
| CN | 104718630 A | 6/2015 |
| CN | 105845769 A | 8/2016 |
| CN | 112201700 A | 1/2021 |
| CN | 113345969 A | 9/2021 |
| CN | 215118914 U | 12/2021 |

(Continued)

OTHER PUBLICATIONS

English language machine translation of Ye et al. (CN 113345969 A). (Year: 2025).*

(Continued)

*Primary Examiner* — Eli S Mekhlin

(74) *Attorney, Agent, or Firm* — Taft, Stettinius & Hollister LLP

(57) ABSTRACT

The present disclosure relates to the field of solar cell technologies. The present disclosure provides a solar cell and a manufacturing method therefor, a photovoltaic module, and a photovoltaic system. The solar cell includes: a substrate; a tunnel oxide layer stacked on a surface of the substrate, the tunnel oxide layer being an oxide layer including at least a silicon element and an oxygen element; and a polysilicon doped conductive layer stacked on a side of the tunnel oxide layer facing away from the substrate. The tunnel oxide layer is doped with a carbon element and a hydrogen element.

17 Claims, 4 Drawing Sheets

(56)                           References Cited

FOREIGN PATENT DOCUMENTS

| CN | 113964212 | A | 1/2022 | |
| CN | 115377228 | A | 11/2022 | |
| CN | 115513338 | A | 12/2022 | |
| CN | 116417527 | A | 7/2023 | |
| DE | 212022000085 | U1 | 6/2023 | |
| WO | WO-2019053368 | A1 * | 3/2019 | ........... H10F 77/211 |
| WO | 2022170860 | A1 | 8/2022 | |
| WO | 2023115787 | A1 | 6/2023 | |

OTHER PUBLICATIONS

English language machine translation of WO-2019053368-A1. (Year: 2025).*

Australian Patent Office, Examination Report No. 1 issued in corresponding Application No. 2024204909, dated Aug. 21, 2024, 8 pp.

Chinese Patent Office, Office Action issued in corresponding Application No. 202311109529.2, dated Dec. 4, 2024, 10 pp.

European Patent Office, Extended Search Report issued in corresponding Application No. 24189665.3, dated Feb. 17, 2025, 9 pp.

Köhler et al., "Wet-Chemical Preparation of Silicon Tunnel Oxides for Transparent Passivated Contacts in Crystalline Silicon Solar Cells," ACS Appl. Mater. Interfaces, 2018, vol. 10, pp. 14259-14263.

* cited by examiner

1

SOLAR CELL AND MANUFACTURING METHOD THEREFOR, PHOTOVOLTAIC MODULE, AND PHOTOVOLTAIC SYSTEM

CROSS-REFERENCE TO RELATED APPLICATIONS

This application claims priority to Chinese patent application No. 2023111095292, filed on Aug. 30, 2023, the content of which is incorporated herein by reference in its entirety.

TECHNICAL FIELD

The present disclosure relates to the field of solar cell technologies, and in particular, to a solar cell and a manufacturing method therefor, a photovoltaic module, and a photovoltaic system.

BACKGROUND

With rapid development of a photovoltaic technology, conversion efficiency of crystalline silicon solar cells is improving year by year. At present, tunnel oxide passivated contact (TOPCon) solar cells stand out by virtue of many advantages such as high efficiency and high process maturity. Many manufacturers in the industry have begun to increase research and development progress of the TOPCon solar cells. In the TOPCon solar cells, typically, a tunnel oxide layer and a polysilicon layer are deposited on a back surface of the solar cell as a passivated contact layer, which can passivate a metal contact region on the back surface of the solar cell, thereby improving cell performance. However, in the related art, a film thickness of the tunnel oxide layer is small, which generally results in a large number of defects and pores in a film layer after film formation. The quality of the film formation cannot be guaranteed, this leads to short circuits in the solar cells, affecting efficiency of the solar cells.

SUMMARY

According to various embodiments of the present disclosure, a solar cell and a manufacturing method therefor, a photovoltaic module, and a photovoltaic system are provided.

In a first aspect, embodiments of the present disclosure provide a solar cell, including: a substrate; a tunnel oxide layer stacked on a surface of the substrate, the tunnel oxide layer being an oxide layer including at least a silicon element and an oxygen element; and a polysilicon doped conductive layer stacked on a side of the tunnel oxide layer facing away from the substrate. The tunnel oxide layer is doped with a carbon element and a hydrogen element.

In an embodiment, the tunnel oxide layer is made of a material including hydrogen-doped $SiO_xC_y$, where x>y, and y/(x+y)>0.5%.

In an embodiment, in $SiO_xC_y$, y/(x+y)>5%.

In an embodiment, the tunnel oxide layer is further doped with a first doping element, the first doping element being the same as a doping element in the polysilicon doped conductive layer.

In an embodiment, the first doping element is a phosphorus element or a boron element.

In an embodiment, when the tunnel oxide layer is doped with the phosphorus element, in the tunnel oxide layer,

2 concentration of the phosphorus element gradually increases from the substrate towards the polysilicon doped conductive layer.

In an embodiment, the tunnel oxide layer is made of a material including silicon oxide, silicon carbide, silicon oxycarbide, hydrogen-doped silicon oxycarbide, and phosphorus-doped silicon oxycarbide.

In an embodiment, the tunnel oxide layer has a single-layer structure formed by silicon oxide, silicon carbide, silicon oxycarbide, hydrogen-doped silicon oxycarbide, and phosphorus-doped silicon oxycarbide.

In an embodiment, a thickness of the tunnel oxide layer ranges from 0.5 nm to 3 nm.

In a second aspect, embodiments of the present disclosure provide a manufacturing method for a solar cell, including: providing a substrate; and sequentially stacking a tunnel oxide layer and a polysilicon doped conductive layer on a first surface of the substrate, where the tunnel oxide layer includes at least a silicon element and an oxygen element and is doped with a carbon element and a hydrogen element.

In an embodiment, the sequentially stacking the tunnel oxide layer and the polysilicon doped conductive layer on the first surface of the substrate includes: sequentially stacking a tunnel material layer and a polysilicon doped material layer on the first surface of the substrate, where the tunnel material layer includes at least a silicon element and an oxygen element and is doped with a carbon element and a hydrogen element; and etching away the tunnel material layer and the polysilicon doped material layer on a second surface of the substrate to form the tunnel oxide layer and the polysilicon doped conductive layer on the first surface of the substrate; where the second surface of the substrate is opposite to the first surface of the substrate.

In an embodiment, the sequentially stacking the tunnel material layer and the polysilicon doped material layer on the first surface of the substrate includes: forming the tunnel material layer including $SiO_xC_y$ on the first surface of the substrate by using a reactive gas source including a carbon source and an oxygen source, where x>y, and y/(x+y)>0.5%; and forming the polysilicon doped material layer on the tunnel material layer, and diffusing a hydrogen element included in the polysilicon doped material layer into the tunnel material layer.

In an embodiment, the forming the tunnel material layer including $SiO_xC_y$ on the first surface of the substrate by using the reactive gas source including the carbon source and the oxygen source includes: forming the tunnel material layer made of $SiO_xC_y$ on the first surface of the substrate by using the carbon source and the oxygen source as the reactive gas source.

In an embodiment, the forming the tunnel material layer made of $SiO_xC_y$ on the first surface of the substrate by using the carbon source and the oxygen source as the reactive gas source includes: introducing the carbon source and the oxygen source into a reaction chamber containing the substrate as the reactive gas source; and ionizing a carbon element and an oxygen element in the reactive gas source into carbon plasma and oxygen plasma respectively, and causing the carbon plasma and the oxygen plasma to form the tunnel material layer made of $SiO_xC_y$ on the first surface of the substrate.

In an embodiment, the carbon source includes at least one of $CO_2$ and CO; and the oxygen source includes at least one of $CO_2$ and CO.

In an embodiment, the forming the tunnel material layer including $SiO_xC_y$ on the first surface of the substrate by using the reactive gas source including the carbon source and the oxygen source includes: forming the tunnel material layer including $SiO_xC_y$ on the first surface of the substrate by using a carbon source, an oxygen source, and a hydrogen source as the reactive gas source, and doping the tunnel material layer with the hydrogen element.

In an embodiment, the forming the tunnel material layer including $SiO_xC_y$ on the first surface of the substrate by using the carbon source, the oxygen source, and the hydrogen source as the reactive gas source, and doping the tunnel material layer with the hydrogen element includes: ionizing a carbon element, an oxygen element, and a hydrogen element in the reactive gas source into carbon plasma, oxygen plasma, and hydrogen plasma respectively, causing the carbon plasma, the oxygen plasma, and the hydrogen plasma to form the tunnel material layer including $SiO_xC_y$ on the first surface of the substrate, and doping the tunnel material layer with the hydrogen element.

In an embodiment, the carbon source includes one or more of $CO_2$, $CO$, and $CO_4$; the oxygen source includes one or more of $N_2O$, $O_3$, $H_2O$, and $CO_2$; and the hydrogen source includes one or more of $CH_4$, $H_2$, $SiH_4$, and $NH_3$.

In an embodiment, the forming the polysilicon doped material layer on the tunnel material layer, and diffusing the hydrogen element included in the polysilicon doped material layer into the tunnel material layer includes: forming an amorphous silicon material layer on a surface of the tunnel material layer facing away from the substrate; and annealing the amorphous silicon material layer to form the polysilicon doped material layer, and diffusing the hydrogen element in the polysilicon doped material layer into the tunnel material layer to dope the tunnel material layer with the hydrogen element.

In a third aspect, embodiments of the present disclosure provide a photovoltaic module, including at least one solar cell string, the solar cell string including at least two solar cells described above.

In a fourth aspect, embodiments of the present disclosure provide a photovoltaic system, including the photovoltaic module described above.

ILLUSTRATION FOR REFERENCE SIGNS

Figure 1:
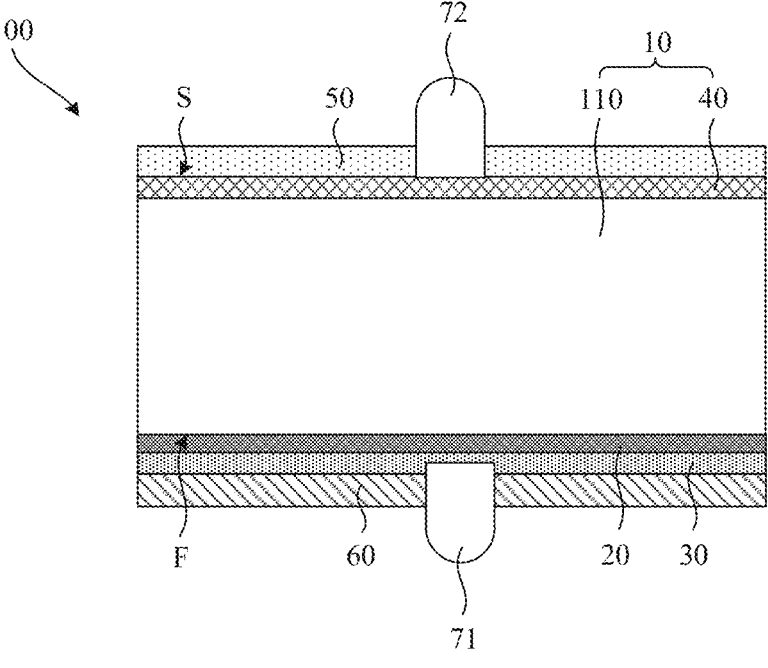
FIG. 1 is a schematic structural diagram of a solar cell according to embodiments of the present disclosure.

100: solar cell;
10: substrate; 110: silicon substrate; 20: tunnel oxide layer; 21: tunnel material layer; 30: polysilicon doped conductive layer; 31: polysilicon doped material layer; F: first surface; S: second surface; 40: doped conductive layer; 50: first passivation film; 60: second passivation film; 71: first electrode; 72: second electrode.

DETAILED DESCRIPTION

In order to make the above objects, features and advantages of the present disclosure more obvious and understandable, specific implementations of the present disclosure are described in detail below with reference to the accompanying drawings. In the following description, many specific details are set forth in order to fully understand the present disclosure. However, the present disclosure can be implemented in many other ways different from those described herein, and those skilled in the art can make similar improvements without departing from the connotation of the present disclosure. Therefore, the present disclosure is not limited by specific embodiments disclosed below.

In the description of the present disclosure, it is to be understood that the orientation or position relationships indicated by the terms "central", "longitudinal", "transverse", "length", "width", "thickness", "upper", "lower", "front", "back", "left", "right", "vertical", "horizontal", "top", "bottom", "inner", "outer", "clockwise", "counterclockwise", "axial", "radial", "circumferential", and the like are based on the orientation or position relationships shown in the accompanying drawings, and are intended to facilitate the description of the present disclosure and simplify the description only, rather than indicating or implying that the apparatus or element referred to must have a particular orientation or be constructed and operated in a particular orientation, and therefore are not to be interpreted as limiting the present disclosure.

In addition, the terms "first" and "second" are used for descriptive purposes only, which cannot be construed as indicating or implying a relative importance, or implicitly specifying the number of the indicated technical features. Therefore, the features defined by "first" and "second" may explicitly or implicitly include at least one of the features. In the description of the present disclosure, "a plurality of" means at least two, such as two or three, unless otherwise defined explicitly and specifically.

In the present disclosure, unless otherwise specified and defined explicitly, the terms "mounting", "connection", "coupling", and "fixation" should be understood in a broad sense, which may be, for example, a fixed connection, a detachable connection, or an integral connection; or a mechanical connection or an electrical connection; or a direct connection, an indirect connection via an intermediate medium; or an internal connection between two elements, or interaction between two elements. Those of ordinary skill in the art can understand specific meanings of these terms in the present disclosure according to specific situations.

In the present disclosure, unless otherwise explicitly specified and defined, the expression a first feature being "on" or "below" a second feature may be the case that the first feature is in direct contact with the second feature, or the first feature is in indirect contact with the second feature via an intermediate medium. Furthermore, the expression first feature being "over", "above" and "on top of" the second feature may be the case that the first feature is directly above or obliquely above the second feature, or only means that the first feature is higher in level than the second feature. The expression the first feature being "below", "underneath" or "under" the second feature may be the case that the first feature is directly underneath or obliquely underneath the second feature, or only means that the first feature is lower in level than the second feature.

It is to be noted that when one element is referred to as being "fixed to" or "arranged on" another element, it may be directly disposed on the other element or an intermediate element may exist. When one element is considered to be "connected to" another element, it may be directly connected to the other element or an intermediate element may exist at the same time. The terms "vertical", "horizontal", "up", "down", "left", "right" and similar expressions used herein are for illustrative purposes only and do not represent an only implementation.

A solar cell and a manufacturing method therefor, a photovoltaic module, and a photovoltaic system according to embodiments of the present disclosure are described below with reference to the accompanying drawings.

FIG. 1 is a schematic structural diagram of a solar cell according to embodiments of the present disclosure.

Referring to FIG. 1, a side surface (e.g., a first surface F) of a substrate 110 of a solar cell 100 according to the embodiments of the present disclosure is provided with a tunnel oxide layer 20 and a polysilicon doped conductive layer 30 as a passivated contact structure. The solar cell 100 may be a TOPCon solar cell or other types of solar cells adopting a passivated contact structure. In a case where other types of solar cells are employed, the tunnel oxide layer and the polysilicon doped conductive layer are arranged similarly and are not repeated herein.

The solar cell 100 according to the embodiments of the present disclosure includes the substrate 10, the tunnel oxide layer 20, and the polysilicon doped conductive layer 30.

The tunnel oxide layer 20 is stacked on a side surface of the substrate 10. The tunnel oxide layer 20 is an oxide layer including at least a silicon element and an oxygen element. The polysilicon doped conductive layer 30 is stacked on a side of the tunnel oxide layer 20 facing away from the substrate 10. The tunnel oxide layer 20 is further doped with a carbon element and a hydrogen element.

The tunnel oxide layer 20 is configured as an oxide layer including a silicon element and an oxygen element and is further doped with a carbon element, so that silicon-carbon-oxygen bonds are formed in the tunnel oxide layer 20. Compared with silicon-oxygen bonds formed in the tunnel oxide layer in the related art, in the present application, the filing of carbon atoms effectively improves defects of the silicon-oxygen bonds, and the generated silicon-carbon-oxygen bonds are denser, atomic density is higher, and pore density is lower, which can effectively improve film formation quality of the tunnel oxide layer 20.

Furthermore, the tunnel oxide layer 20 is further doped with a hydrogen element. Introduction of the hydrogen element further makes up for the defects of the silicon-oxygen bonds, fills in to improve and passivates surface defect states, improves overall passivation quality, and further improves the film formation quality of the tunnel oxide layer 20.

In this way, short circuits in the solar cell 100 can be reduced without increasing a film thickness, resulting in a better passivation effect and improving efficiency of the solar cell 100. On the other hand, the carbon element doped in the tunnel oxide layer 20 can provide a better carrier transport capability, which can effectively reduce resistivity of the tunnel oxide layer 20, reduces series resistance of respective solar cells 100 in the photovoltaic module, and increases a fill factor of the solar cell 100, and improves cell conversion efficiency.

In the embodiments of the present disclosure, the substrate 10 may include a first surface F and a second surface S that are arranged oppositely. The tunnel oxide layer 20 may be arranged on the first surface F. The first surface F may be, for example, a back surface of the solar cell 100. The second surface S may be, for example, a front surface of the solar cell 100.

The tunnel oxide layer 20 is configured to achieve interfacial passivation of the first surface F of the substrate 10 and achieve a chemical passivation effect. The tunnel oxide layer 20 may be made of a dielectric material. In the present disclosure, the tunnel oxide layer 20 may be an oxide layer including at least a silicon element and an oxygen element.

In the embodiments of the present disclosure, in a case where the solar cell 100 is a TOPCon solar cell, the solar cell 100 further includes a first passivation film 50, a second passivation film 60, a first electrode 71, and a second electrode 72.

The substrate 10 includes a silicon substrate 110 and a doped conductive layer 40 stacked on a side of the silicon substrate 110 facing away from the tunnel oxide layer 20.

The first passivation film 50 is stacked on the second surface S of the substrate 10, and the second passivation film 60 is arranged on a side of the polysilicon doped conductive layer 30 facing away from the substrate 10.

The doped conductive layer 40 is configured to form a PN junction with the silicon substrate 110. In the embodiments of the present disclosure, for example, the silicon substrate 110 is N-type. In this case, the doped conductive layer 40 may be P-type doped, for example, a boron-doped doped conductive layer 40 (also called a P+ type emitter).

The first passivation film 50 is stacked on the doped conductive layer 40. The first passivation film 50 plays roles of surface passivation and antireflection in the solar cell 100, which can achieve better chemical passivation on dangling bonds on a surface of the silicon substrate 110 and produce an antireflection effect on the front surface of the solar cell 100.

For example, the first passivation film 50 includes a first passivation layer (not shown) and a first antireflection layer (not shown) sequentially stacked on the doped conductive layer 40.

A first antireflection layer is located on one side of the second surface S of the substrate 10, that is, on a side of the solar cell 100 receiving incident light (called a front surface or a light-receiving surface), and produces an antireflection effect on the front surface of the solar cell 100. The first antireflection layer may adopt a multi-layer structure. In the first antireflection layer of the multi-layer structure, each layer may be made of silicon oxide, silicon nitride, or silicon oxynitride.

The first passivation layer may adopt a single-layer structure or a multi-layer structure, and the first passivation layer may be made of at least one of aluminum oxide, silicon oxide, silicon nitride, and silicon oxynitride.

The second passivation film 60 may also adopt a single-layer structure or a multi-layer structure. The second passivation film 60 may be made of silicon oxide, silicon nitride, or silicon oxynitride. For example, the second passivation film 60 may include at least one second antireflection layer (not shown) stacked on the polysilicon doped conductive layer 30. In this way, reflectivity of the back surface of the solar cell 100 to sunlight can be reduced, and absorptivity of the back surface of the solar cell 100 to sunlight can be improved, so that the second passivation film 60 can produce both passivation and antireflection effects.

In addition, the first electrode 71 is located on the first surface F of the substrate 10. The first electrode 71 extends through the second passivation film 60 and is connected to the polysilicon doped conductive layer 30. The second electrode 72 is located on the second surface S of the substrate 10. The second electrode 72 extends through the first passivation film 50 and is connected to the doped conductive layer 40.

In the embodiments of the present disclosure, in the tunnel oxide layer 20, the silicon element, the oxygen element, and the carbon element exist in the form of compounds. In this way, silicon-carbon-oxygen bonds formed in the tunnel oxide layer 20 have higher atomic density and lower pore density.

In the embodiments of the present disclosure, the tunnel oxide layer 20 is made of a material including hydrogen-doped $SiO_xC_y$ (i.e., $SiO_xC_y$:H), where x>y, and y/(x+y)>0.5%, preferably, y/(x+y)>5%.

x may represent content of the oxygen element in the tunnel oxide layer 20, and y may represent content of the carbon element in the tunnel oxide layer 20. x>y means that the content of the oxygen element in the tunnel oxide layer 20 is greater than the content of the carbon element.

Through x>y and y/(x+y)>0.5%, it is possible to have more oxygen content in the tunnel oxide layer 20, the dielectric insulation performance of the tunnel oxide layer 20 can be ensured, and a selective passing capability of carriers can be improved. In addition, when the above conditions are met, carbon doping can enhance compactness of the tunnel oxide layer 20 and improve an interfacial passivation capability of the tunnel oxide layer 20. Further, the carbon element with the content greater than 0.5% can also enhance conduction and passing capabilities of the carriers and improve collection efficiency of the carriers.

Preferably, x may be 99% and y may be 1%; or x may be 90% and y may be 10%; or x may be 75% and y may be 25%.

It may be understood that the solar cell 100 may include an N-type solar cell and a P-type solar cell. The substrate 10 of the N-type solar cell is doped with an N-type element, and the polysilicon doped conductive layer 30 is also doped with an N-type element. The substrate 10 of the P-type solar cell is doped with a P-type element, and the polysilicon doped conductive layer 30 is also doped with a P-type element.

In other words, the element doped in the polysilicon doped conductive layer 30 may be a P-type element (e.g., a trivalent doping element or a boron element) or an N-type element (e.g., a pentavalent doping element or a phosphorus element).

On the basis of the above scheme, the tunnel oxide layer 20 is further doped with a first doping element. The first doping element is the same as the doping element in the polysilicon doped conductive layer 30. Herein, the first doping element may be formed by diffusing the doping element in the polysilicon doped conductive layer 30 into the tunnel oxide layer 20.

In other embodiments, the first doping element may be a phosphorus element or a boron element. The following description is based on an example in which the first doping element is a phosphorus element. When the doping element is the boron element, the doping concentration of the boron element and effects achieved are similar thereto, which are not repeatedly described in detail herein.

Doping and accumulation of a certain proportion of phosphorus element in the tunnel oxide layer 20 can have a field passivation effect on the substrate 10. In addition, after the doping of phosphorus, a certain proportion of pinhole structures (which do not affect normal functions and compactness of the tunnel oxide layer 20) may further be formed in the tunnel oxide layer 20, which can serve as a transport channel for carriers, reducing transport resistivity of the carriers, and enhancing and improving Rs and electrical performance of the solar cell to some extent.

Further, in the tunnel oxide layer 20, the concentration of the phosphorus element gradually increases from the substrate 10 towards the polysilicon doped conductive layer 30 (that is, the concentration of the phosphorus element is in a certain gradient). The phosphorus element doped in the tunnel oxide layer 20 may, for example, be formed by diffusion of the phosphorus element in the polysilicon doped conductive layer 30 during crystallization of the polysilicon doped conductive layer 30. Therefore, the concentration of the phosphorus element is arranged in an incremental gradient from the substrate 10 towards the polysilicon doped conductive layer 30.

In the embodiments of the present disclosure, the tunnel oxide layer 20 is made of a material including $SiO_xC_y$, and being doped with a hydrogen element. When doped with the hydrogen element, the tunnel oxide layer 20 may include at least one of SiO, SiC, SiOC, and the like, and may further include at least one of SiOCH, SiOH, SiCH, and the like.

In some embodiments, the tunnel oxide layer 20 may include silicon oxide (SiO), silicon carbon (SiC), silicon oxycarbide (SiOC), hydrogen-doped silicon oxycarbide (SiOCH), and phosphorus-doped silicon oxycarbide (SiOCP).

For example, the tunnel oxide layer may include multiple layers of SiO, SiC, SiOC, SiOCH, and SiOCP, and clear boundaries are defined between the layers of SiO, SiC, SiOC, SiOCH, and SiOCP included in the tunnel oxide layer 20.

Alternatively, the tunnel oxide layer 20 may have a structure in which SiO, SiC, SiOC, SiOCH, and SiOCP are mixed into one layer. For example, the tunnel oxide layer 20 has a single-layer structure formed by SiO, SiC, SiOC, SiOCH, and SiOCP.

In an embodiment, a thickness of the tunnel oxide layer 20 ranges from 0.5 nm to 3 nm, preferably, ranges from 0.8 nm to 1.5 nm.

If the thickness of the tunnel oxide layer 20 is greater than 3 nm, a tunneling capability of the carriers may be affected, resulting in high tunneling resistivity. If the thickness of the tunnel oxide layer 20 is less than 0.5 nm, a passivation capability of the surface of the substrate 10 may be poor, and even in the subsequent formation of the polysilicon doped conductive layer 30, the tunnel oxide layer 20 is prone to damage, thereby affecting the final surface passivation effect. By making the thickness of the tunnel oxide layer 20 range from 0.5 nm to 3 nm, the tunneling capability of the carriers is not affected and the passivation effect is better.

Figure 2:
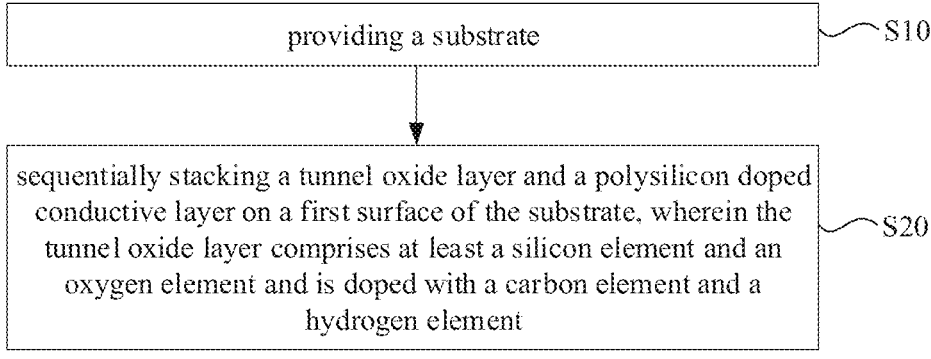
FIG. 2 is a schematic flowchart of a manufacturing method for a solar cell according to embodiments of the present disclosure.
Figure 3:
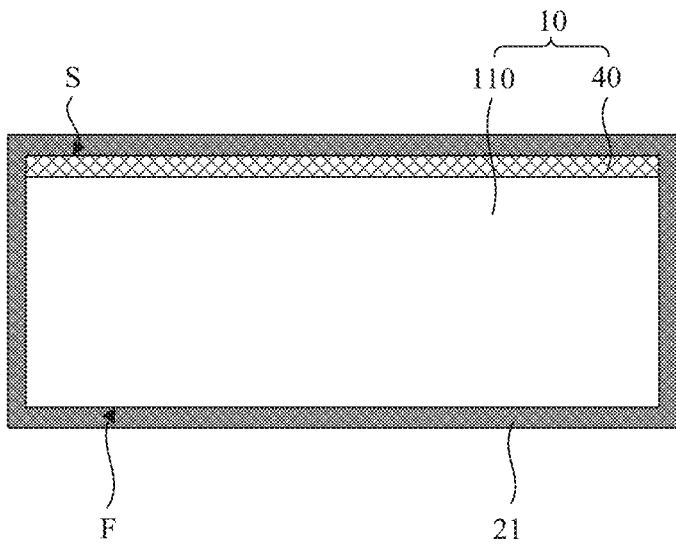
FIG. 3 is a schematic structural diagram of a tunnel material layer formed on a substrate in the manufacturing method for the solar cell according to embodiments of the present disclosure.
Figure 4:
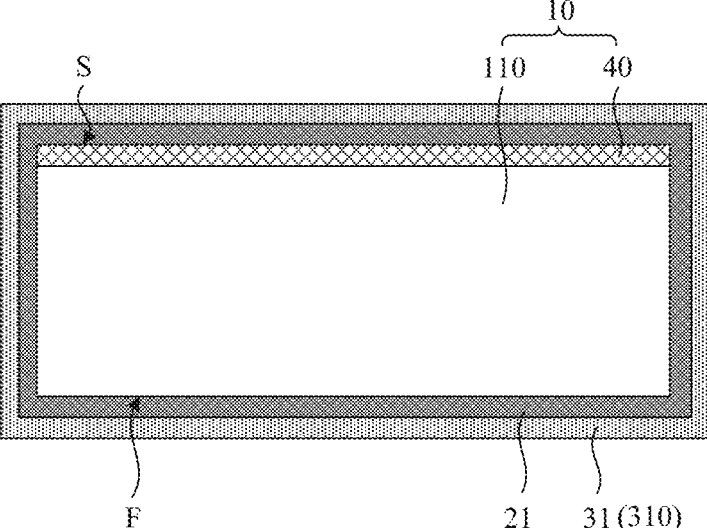
FIG. 4 is a schematic structural diagram of a polysilicon doped conductive material formed on the tunnel material layer in the manufacturing method for the solar cell according to embodiments of the present disclosure.
Figure 5:
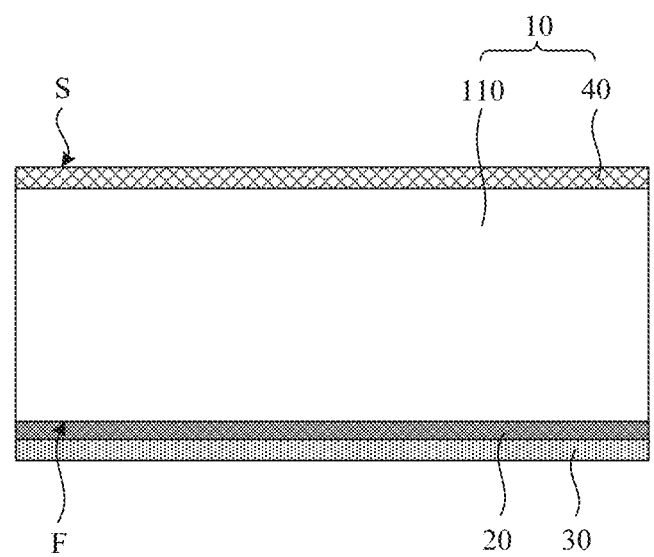
FIG. 5 is a schematic structural diagram of a tunnel oxide layer and a polysilicon doped conductive layer formed in the manufacturing method for the solar cell according to embodiments of the present disclosure.
Figure 6:
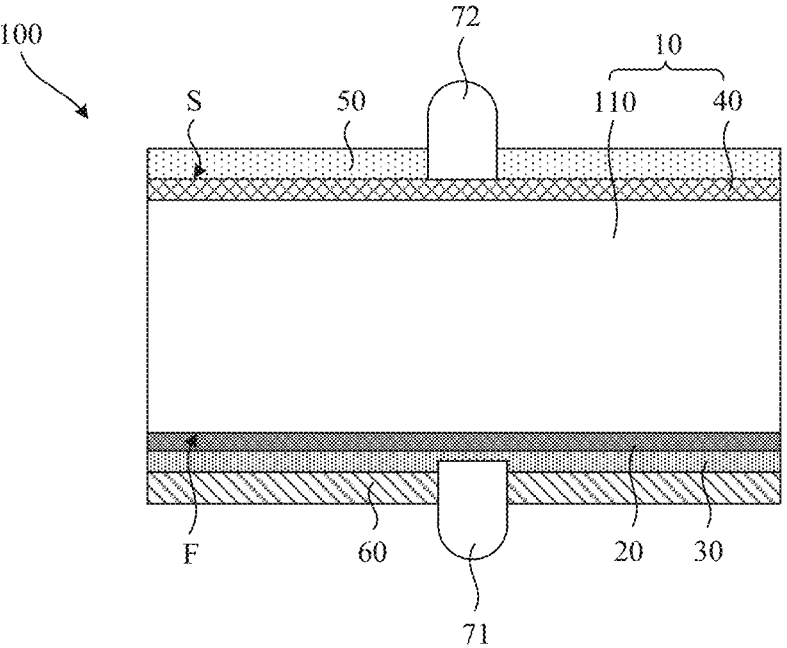
FIG. 6 is a schematic structural diagram of a solar cell formed in the manufacturing method for the solar cell according to embodiments of the present disclosure.

FIG. 2 is a schematic flowchart of a manufacturing method for a solar cell according to embodiments of the present disclosure, FIG. 3 is a schematic structural diagram of a tunnel material layer formed on a substrate in the manufacturing method for the solar cell according to embodiments of the present disclosure, FIG. 4 is a schematic structural diagram of a polysilicon doped conductive material formed on the tunnel material layer in the manufacturing method for the solar cell according to embodiments of the present disclosure, FIG. 5 is a schematic structural diagram of a tunnel oxide layer and a polysilicon doped conductive layer formed in the manufacturing method for the solar cell according to embodiments of the present disclosure, and FIG. 6 is a schematic structural diagram of a solar cell formed in the manufacturing method for the solar cell according to embodiments of the present disclosure.

In a second aspect, embodiments of the present disclosure provide a manufacturing method for a solar cell. Referring to FIG. 2, the manufacturing method for the solar cell according to the embodiments of the present disclosure includes the following steps of S10 to S20.

At S10, a substrate 10 is provided.

At S20, a tunnel oxide layer 20 and a polysilicon doped conductive layer 30 are sequentially stacked on a first surface F of the substrate 10. The tunnel oxide layer 20 includes at least a silicon element and an oxygen element and is doped with a carbon element and a hydrogen element.

The tunnel oxide layer 20 including at least the silicon element and the oxygen element and doped with the carbon element is formed on the first surface F of the substrate 10, so that silicon-carbon-oxygen bonds are formed in the tunnel oxide layer 20. Compared with only silicon-oxygen bonds formed in the tunnel oxide layer in the related art, in the present application, the filing of carbon atoms effectively improves defects of the silicon-oxygen bonds, and the generated silicon-carbon-oxygen bonds are denser, atomic density is higher, and pore density is lower, which can effectively improve film formation quality of the tunnel oxide layer 20.

Furthermore, the tunnel oxide layer 20 is further doped with a hydrogen element. Introduction of the hydrogen element further makes up for the defects of the silicon-oxygen bonds, fills and passivates surface defect states, improves overall passivation quality, and further improves the film formation quality of the tunnel oxide layer 20.

In this way, short circuits in the solar cell 100 can be reduced without increasing a film thickness, resulting in a better passivation effect and improving efficiency of the solar cell 100. On the other hand, the carbon element doped in the tunnel oxide layer 20 provides a better carrier transport capability, effectively reduces resistivity of the tunnel oxide layer 20, reduces series resistance of respective solar cells 100 in the photovoltaic module, and increases a fill factor of the solar cell 100, and improves cell conversion efficiency.

In step S10, the step of providing the substrate 10 includes:

cleaning and texturing respective surfaces of a silicon substrate 110, carrying out doping element diffusion on one of the surfaces (e.g., a surface corresponding to the second surface S of the substrate 10) of the silicon substrate 110, and stacking and forming a doping element conductive material layer and a first oxide material layer (e.g., borosilicate glass (BSG)) on the respective surfaces of the silicon substrate 110; and carrying out first single-sided etching on the silicon substrate 110, to etch away the first oxide material layer and the doping element conductive material (or called an emitter material layer) from another one (e.g., a surface corresponding to the first surface F of the substrate) of the surfaces and each of other side surface of the silicon substrate 110, to form a doped conductive layer 40 on the one of the surfaces of the silicon substrate 110, forming the substrate 10 as shown in FIG. 3.

In step S20, referring to FIGS. 1, 3, and 4, the step of sequentially stacking the tunnel oxide layer 20 and the polysilicon doped conductive layer 30 on the first surface F of the substrate 10 specifically includes:

sequentially stacking a tunnel material layer 21 and a polysilicon doped material layer 31 on the first surface F of the substrate 10, where the tunnel material layer 21 includes at least a silicon element and an oxygen element and is doped with a carbon element and a hydrogen element; and etching away the polysilicon doped material layer 31 and the tunnel material layer 21 on the second surface S of the substrate 10 to form the tunnel oxide layer 20 and the polysilicon doped conductive layer 30 on the first surface F of the substrate 10, as shown in FIG. 5. In this process, the polysilicon doped material layer 31 and the tunnel material layer 21 formed on each of other side surface of the substrate 10 may be partially or completely removed.

Further, when the tunnel material layer 21 and the polysilicon doped material layer 31 are sequentially stacked on the first surface F of the substrate 10, a second oxide material layer may also be formed on the polysilicon doped material layer 31. Prior to subsequent etching away the polysilicon doped material layer 31 and the tunnel material layer 21 on the second surface S of the substrate 10, the second oxide material layer on the second surface S of the substrate 10 may be etched away first.

The process of etching away the second oxide material layer may be carried out in a chain machine, and the process of etching away the polysilicon doped material layer 31 and the tunnel material layer 21 may be carried out in a gutter machine.

It may be understood that "sequentially stacking the tunnel material layer 21 and the polysilicon doped material layer 31 on the first surface F of the substrate 10" means forming the tunnel material layer 21 on the first surface F of the substrate 10 and forming the polysilicon doped material layer 31 on a side of the tunnel material layer 21 facing away from the substrate 10.

Further, the step of sequentially stacking the tunnel material layer 21 and the polysilicon doped material layer 31 on the first surface F of the substrate 10 specifically includes:

forming the tunnel material layer 21 including $SiO_xC_y$ on the first surface F of the substrate 10 by using a reactive gas source including a carbon source and an oxygen source, where x>y, and y/(x+y)>0.5%, preferably, y/(x+y)>5%; and forming the polysilicon doped material layer 31 on the tunnel material layer 21, and diffusing the hydrogen element included in the polysilicon doped material layer 31 into the tunnel material layer 21.

In an embodiment, the step of forming the tunnel material layer 21 including $SiO_xC_y$ on the first surface F of the substrate 10 by using the reactive gas source including the carbon source and the oxygen source specifically includes:

forming the tunnel material layer 21 made of $SiO_xC_y$ on the first surface F of the substrate 10 by using a carbon source and an oxygen source as the reactive gas source. In this process, no hydrogen doping is introduced into the tunnel material layer 21.

During specific implementation, the above steps may include:

introducing the carbon source and the oxygen source into a reaction chamber containing the substrate 10 as the reactive gas source; and ionizing the carbon element in the reactive gas source into carbon plasma, ionizing the oxygen element in the reactive gas source into oxygen plasma, and causing the carbon plasma and the oxygen plasma to form the tunnel material layer 21 made of $SiO_xC_y$ on the first surface F of the substrate 10.

It is noted that, $SiO_xC_y$ being included in the tunnel material layer 21 means that $SiO_xC_y$ is included in the tunnel oxide layer 20.

In the above scheme, during the formation of the tunnel material layer 21, only the carbon element is doped and the hydrogen element is not doped.

Further, the carbon source may include one or two of $CO_2$ and CO; and the oxygen source may include one or two of $CO_2$ and CO.

In a case where both the carbon element and the hydrogen element are doped during the formation of the tunnel material layer 21, the step of forming the tunnel material layer 21 including $SiO_xC_y$ on the first surface F of the substrate 10 by using the reactive gas source including the carbon source and the oxygen source specifically includes:

forming the tunnel material layer 21 including $SiO_xC_y$ on the first surface of the substrate 10 by using the carbon source, the oxygen source, and the hydrogen source as the reactive gas source, in which the tunnel material layer 21 is doped with the hydrogen element. In this way, the tunnel oxide layer 20 may be doped with two types of doping elements, i.e., the carbon element and the hydrogen element, so that the film formation quality of the tunnel oxide layer 20 is better.

During specific implementation, through an ionization process (e.g., ionization under a microwave power source), the carbon element in the reactive gas source may be ionized into carbon plasma, the oxygen element in the reactive gas source may be ionized into oxygen plasma, and the hydrogen element in the reactive gas source may be ionized into hydrogen plasma. Then, the carbon plasma, the oxygen plasma, and the hydrogen plasma are utilized to form the tunnel material layer 21 including $SiO_xC_y$ on the first surface F of the substrate 10, and the tunnel material layer 21 is further doped with the hydrogen element.

During the implementation, the carbon source may include one or more $CO_2$, CO, and $CO_4$, the oxygen source may include one or more of $N_2O$, $O_3$, $H_2O$, and $CO_2$, and the hydrogen source may include one or more of $CH_4$, $H_2$, $SiH_4$, and $NH_3$.

During specific implementation, gases introduced into the reaction chamber may include the following combinations. For example:

the reactive gas source may be $CH_4$ and $N_2O$.

Alternatively, the reactive gas source may be $CH_4$ and $O_3$.

Alternatively, the reactive gas source may be $CH_4$ and $H_2O$.

Alternatively, the reactive gas source may be $CO_2$ and $H_2$.

In the embodiments of the present disclosure, the step of forming the polysilicon doped material layer 31 on the tunnel material layer 21, and diffusing the hydrogen element included in the polysilicon doped material layer 31 into the tunnel material layer 21 specifically includes:

forming an amorphous silicon material layer 310 on a surface of the tunnel material layer 21 facing away from the substrate 10; and annealing the amorphous silicon material layer 310 to form the polysilicon doped material layer 31, and diffusing the hydrogen element and/or the doping element in the polysilicon doped material layer into the tunnel material layer 21 to dope the tunnel material layer 21 with the hydrogen element and/or the doping element in the polysilicon doped material layer (that is, enabling the tunnel oxide layer 20 to be doped with the hydrogen element and/or the doping element in the polysilicon doped material layer).

During specific implementation, the amorphous silicon material layer 310 may be an amorphous silicon material layer containing a doping element. In this way, when the amorphous silicon material layer 310 is annealed, the polysilicon doped material layer 31 may be formed, and the hydrogen element and/or the doping element in the polysilicon doped material layer 31 are/is diffused into the tunnel material layer 21 to dope the tunnel material layer 21 with the hydrogen element and/or the doping element in the polysilicon doped material layer.

In other embodiments, the amorphous silicon material layer 310 may alternatively be an intrinsic amorphous silicon material layer. In this way, when the amorphous silicon material layer 310 is annealed, a doping element source may be introduced to form the polysilicon doped material layer 31. The hydrogen element and/or the doping element in the polysilicon doped material layer 31 are/is diffused into the tunnel material layer 21 to dope the tunnel material layer 21 with the hydrogen element and/or the doping element in the polysilicon doped material layer.

It may be understood that the doping element in the polysilicon doped conductive layer may be N-type (e.g., a phosphorus element), or the doping element may be P-type (e.g., a boron element).

When the doping element is a boron element, the step of forming the polysilicon doped material layer 31 may specifically include:

introducing silane-borane to grow the amorphous silicon material layer 310 containing the boron element, carrying out annealing to form the polysilicon doped material layer 31 containing the boron element, and diffusing the hydrogen element and/or the boron element in the polysilicon doped material layer 31 into the tunnel material layer 21 to dope the tunnel material layer 21 with the hydrogen element and/or the boron element; or introducing silane to grow an intrinsic amorphous silicon material layer, doping the boron source during annealing to form the polysilicon doped material layer 31 containing the boron element, and diffusing the hydrogen element and/or the boron element in the polysilicon doped material layer 31 into the tunnel material layer 21 to dope the tunnel material layer 21 with the hydrogen element and/or the boron element.

When the doping element is the phosphorus element, the step of forming an amorphous silicon material layer 310 containing the phosphorus element on the surface of the tunnel material layer 21 facing away from the substrate 10 specifically includes:

introducing silane and phosphorane at a temperature of 400° C. to 450° C. to react to form the amorphous silicon material layer 310 containing the phosphorus element, where a flow ratio of silane to phosphane is 1:1.

The step of annealing the amorphous silicon material layer 310 containing the phosphorus element specifically includes:

annealing and crystallizing the amorphous silicon material layer 310 containing the phosphorus element for 10 min to 50 min at a temperature of 850° C. to 950° C.

Several specific examples are given below to illustrate the manufacturing method for the solar cell according to the embodiments of the present disclosure.

Example 1

The manufacturing method for the solar cell includes the following steps.

At step B1, a tunnel material layer 21 is formed on a first surface F of the substrate 10.

Specifically, referring to FIG. 3, a temperature of a reaction furnace tube may be heated and stabilized to a range of 380° C. to 450° C., $CO_2$ may be introduced as a reactive gas source, and at a flow rate in a range of 9 slm to 15 slm. Inert gases such as argon and nitrogen are simultaneously introduced to maintain chamber pressure in the reaction furnace tube. The chamber pressure may be controlled in a range of 1800 mtorr to 2500 mtorr. A microwave power source is turned on, and output power of the power source is set to a range of 10000 W to 15000 W to ionize $CO_2$ into carbon plasma and oxygen plasma. The carbon plasma and oxygen plasma react with the first surface F of the substrate 10 to form a tunnel material layer 21 made of $SiO_xC_y$. It may be understood that in this process, side surfaces and part of the second surface S (such as an edge region of the second surface S) of the substrate 10 may also be coated with the tunnel material layer 21 (or side surfaces and the entire second surface S of the substrate 10 may be fully coated with the tunnel material layer 21, as shown in FIG. 3).

It may be understood that the tunnel material layer 21 including $SiO_xC_y$. For example, in the tunnel oxide layer 20, SiO, SiC, and/or SiOC may be formed. That is, the tunnel oxide layer 20 includes at least one of SiO, SiC, and SiOC.

At step C, a polysilicon doped material layer 31 is formed on the tunnel material layer 21.

Specifically, referring to FIG. 4, silane and phosphorane are introduced at a temperature of 400° C. to 450° C. to react to form an amorphous silicon material layer 310 containing the phosphorus element, where a flow ratio of silane to phosphane is 1:1. The amorphous silicon material layer 310 containing the phosphorus element is annealed and crystallized for 10 min to 50 min at a temperature of 850° C. to 950° C., the amorphous silicon material layer 310 are formed into the polysilicon doped material layer 31, and a hydrogen element and/or a phosphorus element in the polysilicon doped material layer 31 are/is diffused into the tunnel material layer 21 to dope the tunnel material layer 21 with the hydrogen element and/or the phosphorus element. Similar to step B1, in this process, at least part of the tunnel material layer 21 located on the side surfaces and the second surface S of the substrate 10 may also be coated by the polysilicon doped material layer 31 (or in a case where the tunnel material layer 21 completely covers the second surface S, the tunnel material layer 21 located on the side surface and the second surface S of the substrate 10 is also completely covered by the polysilicon doped material layer 31, as shown in FIG. 4). Coating positions of the tunnel material layer 21 and the polysilicon doped material layer 31 can vary according to an actual device, which are not limited herein.

At step D, referring to FIG. 5, the polysilicon doped material layer 31 and the tunnel material layer 21 on the second surface S of the substrate 10 are etched away (a second oxide material layer (e.g., phosphosilicate glass (PSG) is also removed if the second oxide material layer is formed), to form the tunnel oxide layer 20 and the polysilicon doped conductive layer 30 on the first surface F of the substrate 10.

At step E, a first passivation film 50 is deposited on the doped conductive layer 40 of the substrate 10; a second passivation film 60 is deposited on the polysilicon doped conductive layer 30; and a second electrode 72 is manufactured on the first passivation film 50; the second electrode 72 is in contact with the doped conductive layer 40; and a first electrode 71 is manufactured on the second passivation film 60; the first electrode 71 is in contact with the polysilicon doped conductive layer 30. As such, the solar cell 100 as shown in FIG. 6 is formed.

Example 2

On the basis of Example 1, a further improvement is made, the remaining steps except step B1 in Example 1 remain unchanged, and step B1 may be replaced with the following step B2.

At step B2, referring to FIG. 3, a temperature of a reaction furnace tube may be heated and stabilized to a range of 380° C. to 450° C., $CO_2$ may be introduced as a reactive gas source, and at a flow rate in a range of 9 slm to 15 slm. Also, $H_2$ is simultaneously introduced to maintain chamber pressure in the reaction furnace tube. The chamber pressure may be controlled in a range of 1800 mtorr to 2500 mtorr. A microwave power source is turned on, and output power of the power source is set to a range of 10000 W to 15000 W, to ionize $CO_2$ into carbon plasma and oxygen plasma and ionize part of $H_2$ into H+ plasma. The carbon plasma, the oxygen plasma and the H+ plasma react with the first surface F of the substrate 10 to form a tunnel material layer 21 including $SiO_xC_y$, and dope the tunnel material layer 21 with a hydrogen element. That is, $SiO_xC_y$:H is formed. It is to be noted that in this case, when H is inevitably doped (for example, SiOCH may be formed), due to uniformity of the reactive gas source introduced, SiO, SiC, SiOC, and/or SiOCH may be formed. That is, the tunnel oxide layer 20 includes at least one of SiO, SiC, SiOC, and SiOCH.

Example 3

On the basis of Example 1, a further improvement is made, the remaining steps except step B1 in Example 1 remain unchanged, and step B1 may be replaced with the following step B3.

At step B3, a temperature of a reaction furnace tube may be heated and stabilized to a range of 380° C. to 450° C., $CH_4$ and $N_2O$ (as an oxygen source) may be introduced as a reactive gas source, and $CH_4$ is introduced at a flow rate of 3 slm to 5 slm, and $N_2O$ is introduced at a flow rate of 9 slm to 15 slm, and a ratio of $CO_4$ to $N_2O$ is 1:3. $H_2$ is simultaneously introduced to maintain chamber pressure in the reaction furnace tube. The chamber pressure may be controlled in a range of 1800 mtorr to 2500 mtorr. A microwave power source is turned on, and output power of the power source is set to a range of 10000 W to 15000 W, to ionize $CH_4$ into carbon plasma and hydrogen plasma and ionize $N_2O$ into oxygen plasma. The carbon plasma, the hydrogen plasm and the oxygen plasma react with the first surface F of the substrate 10 to form a tunnel material layer 21 including $SiO_xC_y$, and dope the tunnel material layer 21 with a hydrogen element. That is, $SiO_xC_y$:H is formed. It is to be noted that in this case, when H is inevitably doped (for example, SiOCH may be formed), SiO, SiC, SiOC, and/or SiOCH may be formed. That is, the tunnel oxide layer 20 includes at least one of SiO, SiC, SiOC, and SiOCH.

Comparative Example 1

At step F, the temperature of the reaction furnace tube is heated and stabilized to about 420° C.; $NO_2$ is introduced as an oxygen source, at a flow rate of 10 slm; an argon inert gas is simultaneously introduced to maintain chamber pressure in the reaction furnace tube, and the chamber pressure may be controlled to 2200 mtorr; the microwave power source is turned on, the output power of the power source is set to 10000 W; $NO_2$ is ionized into oxygen plasma; the oxygen plasma reacts with the back surface of the substrate (a doped conductive layer is formed on the front surface of the substrate) to form a tunnel material layer including $SiO_x$.

At step G, a polysilicon doped material layer is formed on the tunnel material layer.

At step H, the polysilicon doped material layer and the tunnel material layer that are coated on the back surface and respective side surfaces of the substrate, are etched away to form a tunnel oxide layer and a polysilicon doped conductive layer on the back surface of the substrate.

At step I, a first passivation film is deposited on the doped conductive layer; a second passivation film is deposited on the polysilicon doped conductive layer; and a second electrode is manufactured on the first passivation film; the second electrode is in contact with the doped conductive layer; and a first electrode is manufactured on the second passivation film; and the first electrode is in contact with the polysilicon doped conductive layer.

The solar cells 100 manufactured in Example 1 and Comparative Example 1 are tested for cell performance, and test results are recorded in Table 1. Voc denotes an open-circuit voltage; FF denotes a fill factor; Eta denotes conversion efficiency; Isc denotes a short-circuit current; Rs/mohm denotes series resistance; and Implied Voc denotes an implied open-circuit voltage.

TABLE 1

| | Isc/A | Voc/V | FF/% | Rs/mohm | Eta | Implied Voc |
|---|---|---|---|---|---|---|
| Comparative Example 1 | 15.655 | 0.716 | 83.92 | 0.66 | 24.63 | 730 mV |
| Example 1 | 15.657 | 0.717 | 83.97 | 0.62 | 24.68 | 734 mV |

As can be seen from the above experimental results, the implied open-circuit voltage of the solar cell 100 in Example 1 is increased by 4 mV compared with Comparative Example 1. As can be seen from the above, in the solar cell manufactured in the embodiments of the present disclosure, the tunnel oxide layer 20 has lower defect state density, and passivation quality is better. That is, a passivation capability is increased.

In addition, compared with Comparative Example 1, the short-circuit current, the open-circuit voltage, the fill factor, and the conversion efficiency (increased by 0.05%) of the solar cell 100 in Example 1 are all increased, and the series resistance is reduced. As can be seen from the above, the conductive capability of the solar cell 100 in Example 1 has been increased, and various performances have also been improved to some extent.

In a third aspect, embodiments of the present disclosure provide a photovoltaic module (not shown), including at least one solar cell string. The solar cell string includes at least two solar cells 100 as described above. The solar cells 100 may be connected together by series soldering.

In a fourth aspect, embodiments of the present disclosure provide a photovoltaic system (not shown), including the photovoltaic module described above.

The photovoltaic system may be applied to photovoltaic power stations, such as ground power stations, rooftop power stations, and water surface power stations, or applied to devices or apparatuses that use solar energy to generate electricity, such as user solar power supplies, solar street lights, solar cars, and solar buildings. It may be understood that application scenarios of the photovoltaic system are not limited thereto. In other words, the photovoltaic system may be applied to all fields required to use solar energy to generate electricity. Taking a photovoltaic power generation network as an example, the photovoltaic system may include a photovoltaic array, a combiner box, and an inverter. The photovoltaic array may be an array of a plurality of photovoltaic modules. For example, the plurality of photovoltaic modules may form a plurality of photovoltaic arrays. The photovoltaic arrays are connected to the combiner box. The combiner box may combine currents generated by the photovoltaic arrays. The combined current flows through the inverter and is converted into an alternating current suitable for a mains power grid, and then connected to the mains power grid to realize solar power supply.

The technical features of the above-mentioned embodiments can be combined arbitrarily. In order to make the description concise, not all possible combinations of the technical features are described in the embodiments. However, as long as there is no contradiction in the combination of these technical features, the combinations should be considered as in the scope of the specification.

The above-described embodiments only illustrate several implementations of the present disclosure, and the descriptions are relatively specific and detailed, but they should not be construed as limiting the scope of the present disclosure. It should be understood by those of ordinary skill in the art that various modifications and improvements can be made without departing from the concept of the present disclosure, and all fall within the protection scope of the present disclosure. Therefore, the patent protection of the present disclosure shall be subjected to the appended claims.

The invention claimed is:

1. A solar cell, comprising:
a substrate;
a tunnel oxide layer stacked on a surface of the substrate, the tunnel oxide layer including multiple layers, each of the multiple layers is an oxide layer comprising at least a silicon element and an oxygen element; and
a polysilicon doped conductive layer stacked on a side of the tunnel oxide layer facing away from the substrate;
wherein part of the multiple layers of the tunnel oxide layer are doped with a carbon element a hydrogen element;
wherein the multiple layers at least include a layer of silicon oxide (SiO), and a layer of hydrogen-doped silicon oxycarbide (SiOCH), and clear boundaries are defined between the layers of SiO and the layer of SiOCH.

2. The solar cell according to claim 1, wherein the part of the multiple layers further includes a layer of hydrogen-doped $SiO_xC_y$, wherein x>y, and y/(x+y)>0.5%.

3. The solar cell according to claim 2, wherein in $SiO_xC_y$, y/(x+y)>5%.

4. The solar cell according to claim 1, wherein some layers of the part of the multiple layers of the tunnel oxide layer are further doped with a first doping element, the first doping element being the same as a doping element in the polysilicon doped conductive layer.

5. The solar cell according to claim 4, wherein the first doping element is a phosphorus element or a boron element.

6. The solar cell according to claim 5, wherein the first doping element is the phosphorus element, and in the tunnel oxide layer, concentration of the phosphorus element gradually increases from the substrate towards the polysilicon doped conductive layer.

7. The solar cell according to claim 1, wherein a thickness of the tunnel oxide layer ranges from 0.5 nm to 3 nm.

8. A photovoltaic module, comprising at least two solar cells according to claim 1.

9. A manufacturing method for a solar cell, comprising:
providing a substrate; and
sequentially stacking a tunnel oxide layer and a polysilicon doped conductive layer on a first surface of the substrate, wherein the tunnel oxide layer comprises multiple layers, each of the multiple layers includes at least a silicon element and an oxygen element, and part of the multiple layers areis doped with a carbon element or a hydrogen element;
wherein the multiple layers at least include a layer of silicon oxide (SiO), and a layer of hydrogen-doped silicon oxycarbide (SiOCH), and clear boundaries are defined between the layers of SiO and the layer of SiOCH.

10. The manufacturing method according to claim 9, wherein the sequentially stacking the tunnel oxide layer and the polysilicon doped conductive layer on the first surface of the substrate comprises:
sequentially stacking a tunnel material layer and a polysilicon doped material layer on the first surface of the substrate; and
etching away the tunnel material layer and the polysilicon doped material layer on a second surface of the substrate, to form the tunnel oxide layer and the polysilicon doped conductive layer on the first surface of the substrate; wherein the second surface of the substrate is opposite to the first surface of the substrate.

11. The manufacturing method according to claim 10, wherein the sequentially stacking the tunnel material layer and the polysilicon doped material layer on the first surface of the substrate comprises:
forming the tunnel material layer further comprising a layer of $SiO_xC_y$ on the first surface of the substrate by using a reactive gas source comprising a carbon source and an oxygen source, where x>y, and y/(x+y)>0.5%; and
forming the polysilicon doped material layer on the tunnel material layer, and diffusing a hydrogen element comprised in the polysilicon doped material layer into at least the layer of $SiO_xC_y$ in the tunnel material layer.

12. The manufacturing method according to claim 11, wherein the forming the tunnel material layer comprising the layer of $SiO_xC_y$ on the first surface of the substrate by using the carbon source and the oxygen source as the reactive gas source comprises:
introducing the carbon source and the oxygen source into a reaction chamber containing the substrate as the reactive gas source; and
ionizing a carbon element and an oxygen element in the reactive gas source into carbon plasma and oxygen plasma respectively, and causing the carbon plasma and the oxygen plasma to form the layer of $SiO_xC_y$ on the first surface of the substrate.

13. The manufacturing method according to claim 11, wherein the carbon source comprises at least one of $CO_2$ and CO; and the oxygen source comprises at least one of $CO_2$ and CO.

14. The manufacturing method according to claim 11, wherein the forming the tunnel material layer comprising the layer of $SiO_xC_y$ on the first surface of the substrate by using the reactive gas source comprising the carbon source and the oxygen source comprises:
forming the tunnel material layer comprising the layer of $SiO_xC_y$ on the first surface of the substrate by using a carbon source, an oxygen source, and a hydrogen source as the reactive gas source, and doping at least the layer of $SiO_xC_y$ in the tunnel material layer with the hydrogen element.

15. The manufacturing method according to claim 14, wherein the forming the tunnel material layer comprising the layer of $SiO_xC_y$ on the first surface of the substrate by using the carbon source, the oxygen source, and the hydrogen source as the reactive gas source, and doping at least the layer of $SiO_xC_y$ in the tunnel material layer with the hydrogen element comprises:
ionizing a carbon element, an oxygen element, and a hydrogen element in the reactive gas source into carbon plasma, oxygen plasma, and hydrogen plasma respectively, causing the carbon plasma, the oxygen plasma, and the hydrogen plasma to form the layer of $SiO_xC_y$ on the first surface of the substrate, and doping at least the layer of $SiO_xC_y$ in the tunnel material layer with the hydrogen element.

16. The manufacturing method according to claim 14, wherein the carbon source comprises one or more of $CO_2$, CO, and $CO_4$;
the oxygen source comprises one or more of $N_2O$, $O_3$, $H_2O$, and $CO_2$; and
the hydrogen source comprises one or more of $CH_4$, $H_2$, $SiH_4$, and $NH_3$.

17. The manufacturing method according to claim 11, wherein the forming the polysilicon doped material layer on the tunnel material layer, and diffusing the hydrogen element comprised in the polysilicon doped material layer into at least the layer of $SiO_xC_y$ in the tunnel material layer comprises:
forming an amorphous silicon material layer on a surface of the tunnel material layer facing away from the substrate; and
annealing the amorphous silicon material layer to form the polysilicon doped material layer, and diffusing the hydrogen element in the polysilicon doped material layer into at least the layer of $SiO_xC_y$ in the tunnel material layer to dope the tunnel material layer with the hydrogen element.

* * * * *